(12) United States Patent
Young et al.

(10) Patent No.: US 6,383,821 B1
(45) Date of Patent: May 7, 2002

(54) SEMICONDUCTOR DEVICE AND PROCESS

(75) Inventors: David T. Young, Irvine; Hadi Abdul-Ridha, Costa Mesa; Shao-Wen Hsia, Mission Viejo; Maureen R. Brongo, Laguna Hills, all of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/430,729

(22) Filed: Oct. 29, 1999

(51) Int. Cl.[7] .................. H01L 21/00; H01L 21/336
(52) U.S. Cl. .............. 438/6; 438/637; 438/291; 438/666; 438/685; 438/720
(58) Field of Search .............. 438/6, 637, 672, 438/685, 720, 622, 619, 687, 671, 656, 289, 291, 666, 625; 257/774; 148/238, 237, 281

(56) References Cited

U.S. PATENT DOCUMENTS

| | | | | |
|---|---|---|---|---|
| 5,462,890 A | * | 10/1995 | Hwang et al. | 438/637 |
| 5,658,811 A | * | 8/1997 | Kimura et al. | 438/289 |
| 5,776,264 A | * | 7/1998 | McCandish et al. | 148/237 |
| 6,037,248 A | * | 3/2000 | Ahn | 438/619 |
| 6,048,792 A | * | 4/2000 | Watanabe et al. | 438/656 |

OTHER PUBLICATIONS

S.B. Herner, H.–M. Zhang, B. Sun, Y. Tanaka, A. Littau, and G. Dixit, "Bias Sputtered Tungsten as a Diffusion Barrier and Nucleation Film for Tungsten CVD in Vias", Advanced Mettalization for ULSI Applications in 1999. Materials Research Society Conference Proceedings, 1999, to be published.

* cited by examiner

Primary Examiner—Matthew Smith
Assistant Examiner—Igwe U. Anya
(74) Attorney, Agent, or Firm—Thomas, Kayden, Horstemeyer & Risley

(57) ABSTRACT

A process for manufacturing a semiconductor device includes the formation of tungsten contact plugs suitable for very small geometry devices. As part of the process a tungsten barrier layer is deposited into vias and covering the walls of the vias by a process of ionized metal plasma deposition. The tungsten layer deposited in this manner provides a barrier layer, adhesion layer, and nucleation layer for the subsequent chemical vapor deposition of tungsten contact plug material. Together the two layers of tungsten form contact plugs having a low resistance even when used in the fabrication of very small geometry devices.

18 Claims, 2 Drawing Sheets

SEMICONDUCTOR DEVICE AND PROCESS

BACKGROUND OF THE INVENTION

This invention relates generally to a semiconductor device and to a process for manufacturing a semiconductor device, and more specifically to an improved process for fabricating a semiconductor device using a contact plug technology and to a device incorporating the contact plug.

As the geometries utilized in the fabrication of semiconductor devices are reduced to smaller and smaller dimensions, it becomes difficult to provide a reliable contact to impurity doped electrically active regions or to other electrically conductive elements. One technique that is used to provide a contact to an underlying electrically conductive element is the contact plug technology. Electrically conductive elements are often buried beneath or within one or more dielectric layers. In the contact plug technology a hole or opening is formed through the dielectric material to expose a portion of the underlying electrically conductive element. A plug of electrically conductive material such as a metal, often tungsten metal, is formed in the opening through the dielectric material and electrically contacts the electrically conductive element. The conductive plug extends to the surface of the dielectric material where it is contacted by a patterned interconnect metal layer. Electrical contact is thus established between the electrically conductive element and the patterned interconnect metal layer.

In accordance with prior art conductive plug technologies, the plug is usually formed by chemical vapor depositing the conductive plug material in the opening formed through the dielectric material. If the plug material is tungsten, the plug is formed by the chemical vapor deposition (CVD) of tungsten, usually by reducing tungsten hexafluoride ($WF_6$). Both $WF_6$ and fluorine, the by-product of the reduction reaction, are highly reactive with many of the commonly used dielectric materials. As a result, the conventional plug technology requires the use of a barrier layer to protect the exposed dielectric material from unwanted reaction with the $WF_6$ and fluorine during the CVD process. The most commonly used barrier material is a layer of titanium nitride (TiN). Although the TiN forms a satisfactory barrier layer when the contact opening through the dielectric material is of the order of 0.4 microns or greater, it is unsatisfactory when the contact opening shrinks to smaller dimensions, such as a diameter of about 0.1–0.2 microns.

TiN is unsatisfactory as a barrier material for very small contact openings for at least two reasons. First, the TiN is usually deposited to a thickness of about 10–20 nanometers (nm). Although this thickness of TiN is relatively insignificant for a large diameter contact opening (i.e., about 0.4 microns or larger), a layer of such thickness fills a considerable portion of the smaller size contact opening (i.e., a contact opening having a diameter of about 0.1–0.2 microns). Although TiN is electrically conductive, it is less so than tungsten. Because the resistance of the contact plug is inversely proportional to the cross sectional area of the contact, decreasing the diameter of the more conductive material increases the resistance through the plug. Additionally, TiN barrier layers, especially in small size contact openings, cause a problem with high contact resistance to the underlying electrically conductive element.

It should be noted that the barrier layer, in addition to functioning to protect the underlying dielectric material from unwanted reaction with the $WF_6$ and fluorine, also functions to provide an adhesion promoter for the chemical vapor deposited tungsten layer and as a nucleating site for the uniform deposition of the deposited tungsten layer. In the absence of a nucleating material formed uniformly over the surface, the chemical vapor deposition of tungsten onto a dielectric material is difficult and produces a nonuniform and often noncontinuous tungsten layer. In addition, in the absence of an adhesion promoting layer, tungsten does not adhere well to most dielectric materials. Hence in the absence of a barrier layer/adhesion promoter, the chemical vapor deposited layer of tungsten may cause reliability problems by peeling or separating from the underlying dielectric material.

In view of the problems enumerated above with respect to the existing tungsten contact plug technologies, a need exists for a semiconductor manufacturing process that includes an improved contact plug technology that will provide a low total resistance contact to the electrically conductive element to be contacted, that will provide good adhesion of the contact plug to the adjacent dielectric materials, and that will provide a nucleating site for the deposition of a contact plug material to provide uniform and reliable contact plug deposition conditions, especially for small geometry contact openings. In addition, a need exists for an improved semiconductor device, especially a small geometry semiconductor device employing improved, low resistance contact plugs to contact electrically conductive elements.

BRIEF SUMMARY OF THE INVENTION

In accordance with one embodiment of the invention, especially in view of the foregoing expressed needs, a process for manufacturing a semiconductor device is provided that includes an improved contact plug technology in which an ionized metal plasma technique is used to provide a barrier layer. The ionized metal plasma technique not only provides an acceptable barrier layer having low contact resistance, the new technique also provides a nucleating layer for the uniform deposition of the contact plug material. The barrier layer formed in this manner is also adherent to the commonly used dielectric materials. In accordance with a further embodiment of the invention, an improved semiconductor device is provided that is fabricated using the improved contact plug technology.

DETAILED DESCRIPTION OF PREFERRED EMBODIMENTS

FIGS. 1–6 illustrate process steps in accordance with one embodiment of the invention. In these FIGURES, a portion of a semiconductor device 10, in accordance with an embodiment of the invention, is illustrated in cross-section. Device 10 can be any analog or digital integrated circuit or can be a discrete device. Although the method in accordance with the various embodiments of the invention is particularly applicable to the fabrication of small geometry devices, it is not limited to such devices.

Figure 1:
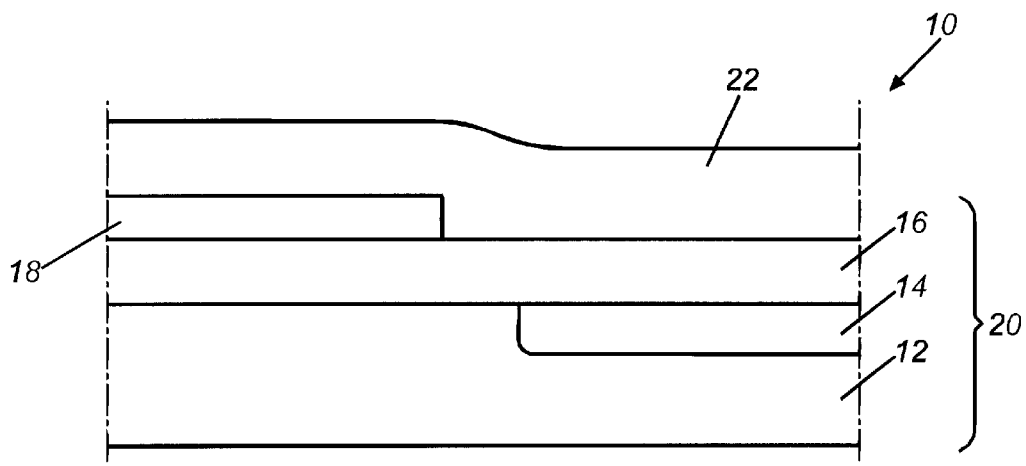
FIGS. 1–6 illustrate, in cross-sections through a portion of a semiconductor device, process steps in accordance with one embodiment of the invention.

FIG. 1 illustrates, in cross-section, a portion of semiconductor device 10 at an early stage in the fabrication of that device. Device 10 may include a repetition of the structure illustrated in the FIGURE in addition to other elements that are not illustrated. In accordance with one embodiment of the invention, semiconductor device 10 includes a semiconductor wafer 12 which can be, for example, silicon, gallium arsenide, or other semiconductor material. Semiconductor wafer 12 may include electrically conductive elements 14 comprising impurity doped regions formed by ion implantation, diffusion, or the like. One or more dielectric layers 16 may overlie semiconductor wafer 12 to provide device isolation, capacitor dielectrics, and the like. Dielectric layers 16 may comprise a silicon oxide, silicon nitride, or other dielectric materials commonly used in the semiconductor industry. Additional electrically conductive elements 18 may be formed overlying portions of dielectric layer 16. Electrically conductive element 18 may comprise polycrystalline silicon, a metal silicide, metals, or other conductive materials. Electrically conductive element 18 may be used to interconnect various device regions, to form a gate or other device electrode, to form a capacitor plate, a resistor, or another electronic component or portion thereof. Collectively the semiconductor wafer 12, dielectric layer 16, and electrically conductive elements 14 and 18 will hereinafter be referred to as the semiconductor substrate 20.

In accordance with an embodiment of the invention, a dielectric layer 22 is formed overlying semiconductor substrate 20. Dielectric layer 22 can be used to provide device isolation, to form a capacitor dielectric, or the like. Like dielectric layer 16, dielectric 22 may be a silicon oxide, silicon nitride, a high-K dielectric material, or the like.

Figure 2:
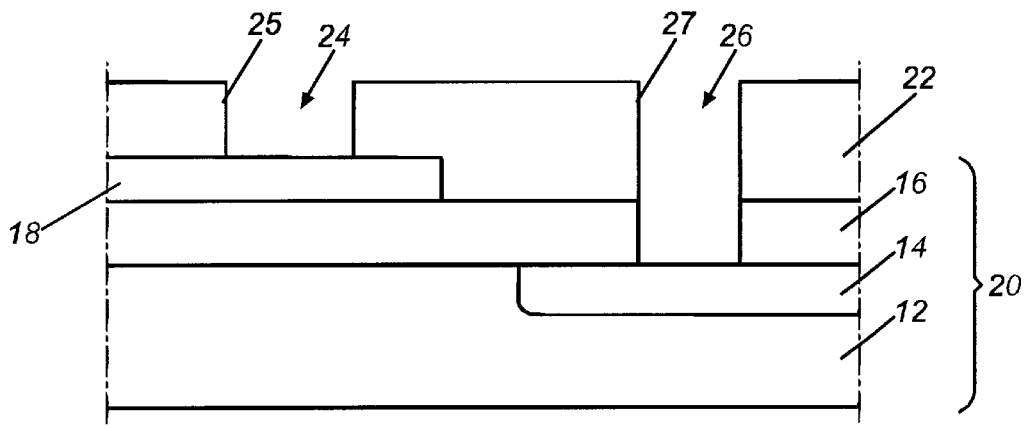
Figure 3:
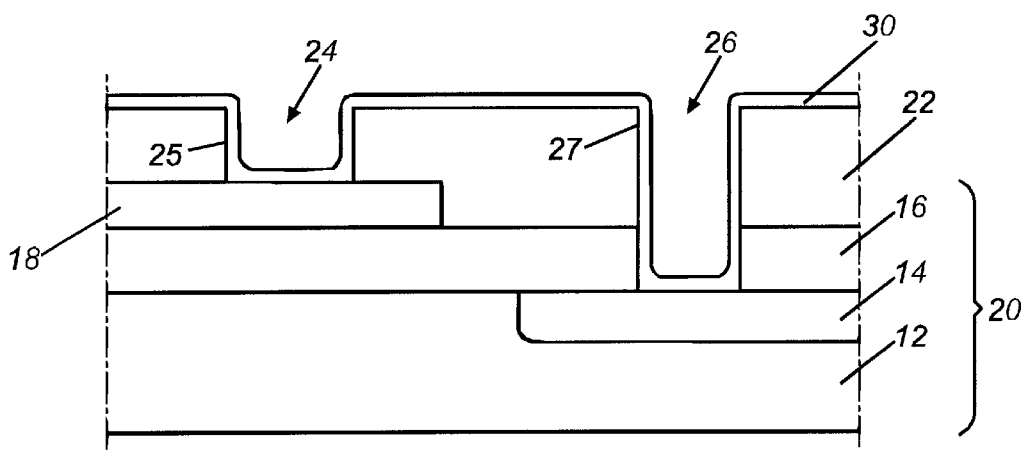

As illustrated in FIG. 2, in accordance with one embodiment of the invention, openings or vias are formed through dielectric layer 22, and, if necessary, dielectric layer 16 to expose portions of the underlying electrically conductive elements. Via 24, bounded by side walls 25, exposes a portion of electrically conductive element 18. Via 26, bounded by side walls 27, exposes a portion of underlying electrically conductive element 14. In accordance with various embodiments of the invention, vias 24 and 26 may be formed simultaneously or may be formed in separate processing steps. Additionally, it is not necessary that both via 24 and 26 be formed; whether one or both vias is formed will depend upon the particular semiconductor device being manufactured. For purposes of illustration, however, FIG. 2 depicts the formation of both via 24 and via 26 contacting electrically conductive elements 18 and 14, respectively. Vias 24 and 26 can be formed, for example, using conventional photolithographic patterning and etching. The vias can be etched, for example, by wet chemical etching, plasma etching, or by one of the anisotropic etching techniques such as reactive ion etching.

In accordance with one embodiment of the invention, a barrier layer 30 is deposited overlying dielectric layer 22 and especially overlying side walls 25 and 27 of vias 24 and 26 and those portions of electrically conductive elements 14 and 18 that are exposed at the bottoms of the vias. In accordance with this embodiment of the invention, barrier layer 30 is deposited by the process of ionized physical vapor deposition, also sometimes referred to as ionized metal plasma deposition. In accordance with a preferred embodiment of the invention, barrier layer 30 is a layer of tungsten deposited by ionized physical vapor deposition. Although the preferred material for the barrier layer is ionized physical vapor deposited tungsten, any ionized physical vapor deposited material may be used, provided the material forms a chemical barrier to protect the exposed dielectric material from reactants produced in subsequent processing steps, adheres to the dielectric material and to the subsequently deposited contact plug material, is electrically conductive, and provides a nucleating site for the subsequent deposition of the contact plug material.

In the ionized physical vapor deposition process, for example, for the deposition of tungsten in accordance with a preferred embodiment, a target of pure tungsten is provided. Tungsten atoms are sputtered from the tungsten source by the known technique of bombarding the target with atoms of argon or other noble gas. The tungsten atoms removed from the target by sputtering are then subjected to an ionizing plasma to create tungsten ions that are then deposited on the dielectric material 22, the vias, via side walls, and electrically conductive elements. In accordance with a preferred embodiment, the ionized metal plasma deposited tungsten is deposited to a thickness of about 20–30 nm.

Figure 4:
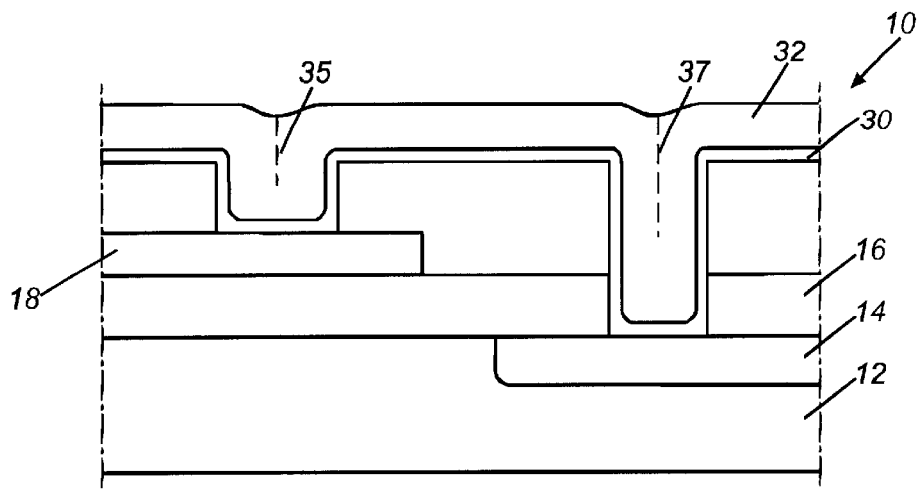

The process continues, as illustrated in FIG. 4 by the deposition of a layer of conductive plug material 32 overlying barrier layer 30. In accordance with a preferred embodiment of the invention, the conductive plug material is tungsten deposited by chemical vapor deposition from the reduction of tungsten hexafluoride. The use of the tungsten hexafluoride source necessitates the use of barrier layer 30 because, in the absence of a barrier layer, fluorine atoms released during the reaction can subsequently react with the underlying dielectric layers in an undesired manner. Barrier layer 30 thus protects the underlying dielectric layers from the undesired reaction. The layer of tungsten plug material is preferably deposited to a sufficient thickness to completely fill vias 24 and 26. As illustrated, the CVD process for filling openings such as vias 24 and 26 leaves seams 35, 37 in the center of the vias. In extreme cases, if the deposition process closes the top of the via prematurely, the seam can even be so extensive as to form a void. Voids can lead to long term reliability problems in the finished device. The inventors have discovered, however, that the problem with seam formation is significantly reduced when using a barrier layer/nucleating layer formed by ionized physical vapor deposition.

Figure 5:
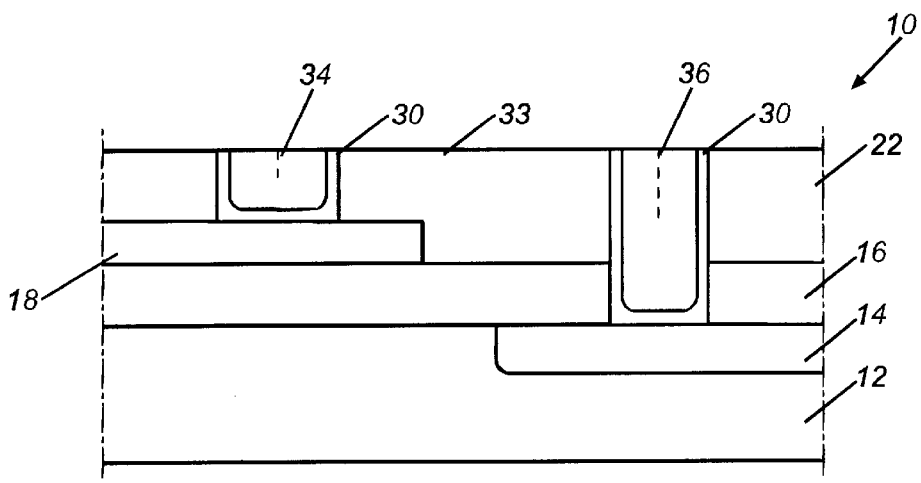

After depositing layer 32, the process continues, in accordance with one embodiment of the invention, by planarizing the top surface of the structure using a chemical mechanical polishing (CMP) process. The CMP process planarizes the top surface of dielectric layer 22 to provide a substantially planar surface 33 and also removes those portions of barrier layer 30 and layer of plug material 32 that overlie the top surface of dielectric layer 22. The resulting structure, as illustrated in FIG. 5, comprises isolated contact plugs 34 and 36 filling vias 24 and 26, respectively. Contact plug 34, together with the remaining portion of barrier layer 30 contacted by contact plug 34, provides an electrical contact to electrically conductive element 18. Contact plug 36, together with the associated remaining portion of barrier layer 30, provides an electrical contact to electrically conductive element 14.

The process continues by the deposition of a layer of aluminum, copper, or other conductive material overlying planarized surface 33 of dielectric layer 22. The layer of aluminum or other conductive material is photolithographically or otherwise patterned to form a device electrode 40 contacting plug 34 and a device electrode 42 electrically contacting plug 36 as illustrated in FIG. 6.

Figure 6:
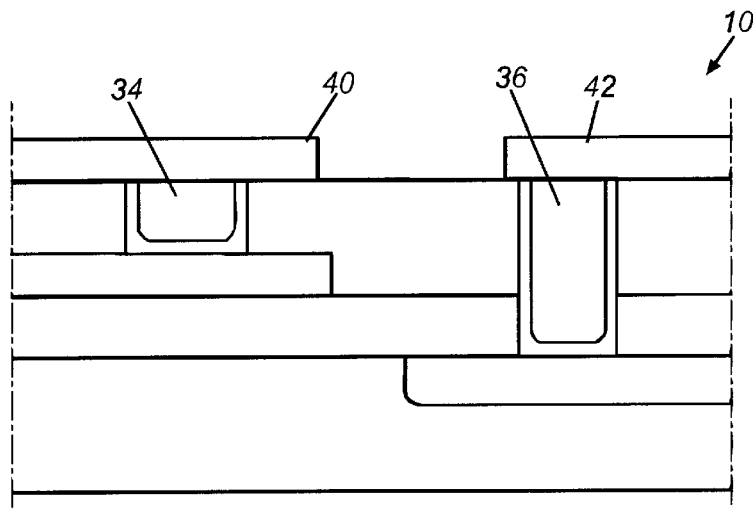

Device 10, as illustrated in FIG. 6, may require additional conventional processing steps such as passivation, back metallization, dicing, packaging, and the like, to realize a completed and functional device. In accordance with one embodiment of the invention, device 10 may require additional interconnect layers that would be separated by additional dielectric layers. Contact to and between interconnect layers may be implemented by fabricating additional contact plugs in the manner described and illustrated above.

The process, in accordance with the various embodiments of the invention, is particularly applicable to semiconductor devices having small vias, that is, vias having a diameter of less than about 0.1–0.2 microns. The process is also applicable to devices having larger vias although it may not be necessary for such devices. The use of a barrier layer deposited by ionized metal plasma deposition overcomes the problems attendant with prior art semiconductor device fabrication processes. Such a barrier layer provides a reduced contact resistance, especially if the barrier layer is formed of tungsten in accordance with the preferred embodiment of the invention. Such a barrier layer also functions as an adhesion promoter for the subsequently deposited CVD plug material. In addition, the barrier layer advantageously forms a nucleation site for the deposition of the chemical vapor deposited plug material. The ionized metal plasma deposition of the barrier layer reduces the incidence of voids in the CVD plug material.

In accordance with a preferred embodiment of the invention, the ionized metal plasma deposited tungsten barrier layer is deposited in such a manner as to form an amorphous tungsten layer of very fine grain size. The fine grained amorphous tungsten layer has been found to adhere to the underlying dielectric, to provide a layer to which the CVD tungsten readily adheres, and to form an excellent nucleation site for the uniform chemical vapor deposition of the tungsten plug material. A barrier layer of tungsten having these desired properties can be deposited, for example, in the Vectra model of ionized metal plasma deposition equipment available from Applied Materials.

In accordance with a further preferred embodiment of the invention, the barrier layer and the subsequent layer of plug material are deposited sequentially in a cluster tool without exposing the material to an oxidizing ambient between the deposition steps. A preferred process thus comprises the steps of de-gassing the equipment and the semiconductor substrate with its layers of dielectric material, reactive sputter cleaning the surface upon which the barrier layer is to be deposited, deposition of the barrier layer by the ionized metal plasma deposition of tungsten, and finally the chemical vapor deposition of the tungsten plug material, all accomplished without exposing the device to an oxidizing ambient between processing steps.

Thus it is apparent that there has been provided, in accordance with the invention, a semiconductor device and a process for manufacturing a semiconductor device which fully meets the needs set forth above. Although the invention has been described and illustrated with reference to specific embodiments thereof, it is not intended that the invention be limited to these illustrative embodiments. For example, although the process has been described with specific reference to the use of a tungsten barrier layer and a tungsten plug material, those of skill in the art will recognize that other materials can be used in place of tungsten. Accordingly, it is intended that all such variations and modifications be included within the scope of the appended claims.

What is claimed is:

1. A process for manufacturing a semiconductor device comprising the steps of:
   providing a semiconductor substrate;
   forming a dielectric layer overlying the substrate;
   forming an opening extending through the dielectric layer and exposing a portion of the underlying substrate, the opening bounded by sidewalls;
   depositing a first layer of tungsten into the opening by an ionized physical vapor deposition technique to cover the sidewalls of the opening and the exposed portion of the underlying substrate; and
   chemical vapor depositing a second layer of tungsten overlying the first layer of tungsten.

2. The process of claim 1 further comprising the step of planarizing the dielectric layer and removing portions of the first and second layers overlying the dielectric layer.

3. The process of claim 1 wherein the step of chemical vapor depositing is accomplished without exposing the first layer to an oxidizing ambient.

4. A process for manufacturing a semiconductor device comprising the steps of:
   providing a semiconductor substrate including an electrically conductive element;
   forming a dielectric layer overlying the substrate;
   etching an orifice having sidewalls into the dielectric layer to expose a portion of the electrically conductive element;
   depositing a first layer of a barrier material by ionized physical vapor deposition, the first layer having a first portion overlying the dielectric layer and a second portion forming a continuous film overlying the sidewalls of the orifice and the exposed portion of the electrically conductive element;
   chemical vapor depositing a second layer of metal having a first portion overlying the first portion of the first layer and a second portion of the second layer substantially filling the orifice before the first layer is exposed to an oxidizing ambient;
   polishing the dielectric layer to planarize a surface thereof and to remove the first portions of the first layer and the second layer, leaving the second portions substantially filling the orifice;
   depositing a layer of metal conductor overlying the planarized surface and contacting the second portion of the second layer; and
   patterning the layer of metal to form interconnect metalization electrically coupled to the electrically conductive element.

5. The process of claim 4 wherein the step of providing a semiconductor substrate comprises providing a semiconductor wafer having an impurity doped region formed therein.

6. The process of claim 4 wherein the step of providing a semiconductor substrate comprises providing a semiconductor wafer having a device electrode formed thereover.

7. The process of claim 4 wherein the step of depositing a first layer comprises depositing a layer of tungsten.

8. The process of claim 7 wherein the step of chemical vapor depositing comprises chemical vapor depositing a layer of tungsten.

9. The process of claim 8 wherein the step of depositing a layer of metal comprises the step of depositing a layer of aluminum.

10. A process for manufacturing a semiconductor device comprising the steps of:
   providing a semiconductor substrate comprising an electrically conductive element;
   forming a dielectric layer having a surface, the dielectric layer overlying the substrate;
   forming a via extending into the dielectric layer from the surface to expose a portion of the electrically conductive element, the via being bounded by sidewalls;
   providing a tungsten source;
   sputtering tungsten atoms from the source;
   subjecting the tungsten atoms to an electrical plasma to form tungsten ions;
   depositing the tungsten ions to form a first layer of tungsten overlying the dielectric layer surface, the sidewalls of the via, and the exposed portion of the electrically conductive element; and chemical vapor depositing tungsten overlying the first layer of tungsten.

11. The process of claim 10 wherein the step of depositing the tungsten ions comprises depositing amorphous tungsten.

12. The process of claim 10 wherein the step of depositing the tungsten ions comprises depositing fine grained amorphous tungsten.

13. The process of claim 10 further comprising the step of planarizing the surface of the dielectric layer and thereby removing portions of the first layer and the chemical vapor deposited tungsten overlying the surface.

14. A semiconductor device comprising:

a semiconductor substrate including an electrically conductive element;

a dielectric layer overlying the substrate;

a via formed in the dielectric layer and exposing a portion of the electrically conductive element, the via bounded by a sidewall;

a barrier layer of ionized physical vapor deposited tungsten in the via and covering the sidewalls thereof; and a layer of chemical vapor deposited metal overlying the barrier layer and providing electrical contact to the electrically conductive element.

15. The semiconductor device of claim 14 wherein the barrier layer comprises fine grained amorphous tungsten.

16. The semiconductor device of claim 15 wherein the layer of chemical vapor deposited metal comprises tungsten.

17. The semiconductor device of claim 14 wherein the layer of chemical vapor deposited metal comprises tungsten.

18. The semiconductor device of claim 14 further comprising a layer of patterned interconnect metalization electrically contacting the chemical vapor deposited metal.

* * * * *